United States Patent
Otsuka et al.

(10) Patent No.: US 12,451,374 B2
(45) Date of Patent: Oct. 21, 2025

(54) BONDING SYSTEM AND INSPECTION METHOD OF INSPECTING COMBINED SUBSTRATE

(71) Applicant: Tokyo Electron Limited, Tokyo (JP)

(72) Inventors: Yoshitaka Otsuka, Koshi (JP); Shigeto Tsuruta, Koshi (JP); Yuji Mimura, Koshi (JP); Hiroshi Maeda, Koshi (JP); Eiji Manabe, Koshi (JP); Hisanori Hizume, Sapporo (JP); Shinichi Shinozuka, Koshi (JP); Hironori Tanoue, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 755 days.

(21) Appl. No.: 17/754,659

(22) PCT Filed: Sep. 28, 2020

(86) PCT No.: PCT/JP2020/036623
§ 371 (c)(1),
(2) Date: Apr. 8, 2022

(87) PCT Pub. No.: WO2021/070661
PCT Pub. Date: Apr. 15, 2021

(65) Prior Publication Data
US 2022/0415673 A1   Dec. 29, 2022

(30) Foreign Application Priority Data
Oct. 10, 2019   (JP) .................. 2019-186568

(51) Int. Cl.
*H01L 21/67*   (2006.01)
*G06T 7/00*    (2017.01)

(52) U.S. Cl.
CPC ........ *H01L 21/67092* (2013.01); *G06T 7/001* (2013.01); *H01L 21/67288* (2013.01); *G06T 2207/30148* (2013.01)

(58) Field of Classification Search
CPC ......... H01L 21/67092; H01L 21/67288; H01L 21/02; H01L 21/681; H01L 21/6838;
(Continued)

(56) References Cited

U.S. PATENT DOCUMENTS 9,097,681 B2 *   8/2015   Koga ................ G01N 21/9505
2002/0174958 A1 *  11/2002  Yanagita ........... H01L 21/67253
                                                     156/755
(Continued)

FOREIGN PATENT DOCUMENTS

JP    106-112295 A    4/1994
JP    4174399 B2     10/2008
(Continued)

OTHER PUBLICATIONS

International Search Report for PCT/JP2020/036623 dated Dec. 15, 2020.

*Primary Examiner* — Kathleen Y Dulaney
(74) *Attorney, Agent, or Firm* — Chrisman Gallo Tochtrop LLC

(57) ABSTRACT

A bonding system includes a bonding device, an inspection device and a controller. The bonding device forms a combined substrate by bonding a first substrate and a second substrate to each other. The inspection device inspects the combined substrate. The controller controls the inspection device. The controller includes a measurement controller, a comparison unit and a re-measurement controller. The measurement controller causes the inspection device to measure the combined substrate at a first number of measurement points. The comparison unit compares, with a reference, an inspection result including a deviation amount between the
(Continued)

first substrate and the second substrate in the combined substrate based on a measurement result. The re-measurement controller causes the inspection device to re-measure the combined substrate at a second number of measurement points greater than the first number of measurement points based on a comparison result obtained by the comparison unit.

10 Claims, 11 Drawing Sheets

(58) Field of Classification Search
CPC . H01L 21/67121; H01L 21/187; H01L 22/12; H01L 24/80; H01L 2224/80; G06T 7/001; G06T 2207/30148
USPC .............. 382/145; 156/64, 378; 438/455, 16
See application file for complete search history.

(56) References Cited

U.S. PATENT DOCUMENTS

| | | | |
|---|---|---|---|
| 2008/0061394 A1* | 3/2008 | Nakagawa | G02F 1/133512 257/435 |
| 2010/0139836 A1* | 6/2010 | Horikoshi | H01L 21/67092 156/64 |
| 2010/0189340 A1* | 7/2010 | Ueda | G01N 21/956 29/703 |
| 2012/0218455 A1* | 8/2012 | Imai | G02B 13/001 348/340 |
| 2013/0139950 A1* | 6/2013 | Kannaka | G01B 11/272 356/138 |
| 2013/0157391 A1* | 6/2013 | Estermann | G01N 21/9501 356/237.5 |
| 2015/0017782 A1* | 1/2015 | Akiyama | H01L 21/67092 438/455 |
| 2021/0050243 A1* | 2/2021 | Otsuka | H01L 21/67259 |
| 2021/0247701 A1* | 8/2021 | Li | G03F 7/70725 |
| 2021/0249287 A1* | 8/2021 | Mimura | H01L 21/02 |
| 2021/0350999 A1* | 11/2021 | Fukuda | G01N 1/28 |

FOREIGN PATENT DOCUMENTS

| | | | | |
|---|---|---|---|---|
| JP | 2011-066287 | A | | 3/2011 |
| JP | 2011-187716 | A | | 9/2011 |
| JP | 2015-119088 | A | | 6/2015 |
| WO | 2019/087707 | A1 | | 5/2019 |
| WO | 2019/146427 | A1 | | 8/2019 |
| WO | WO-2019208214 | A1 | * | 10/2019 ......... G01N 21/9501 |

* cited by examiner

BONDING SYSTEM AND INSPECTION METHOD OF INSPECTING COMBINED SUBSTRATE

CROSS-REFERENCE TO RELATED APPLICATIONS

This Application is a U.S. national phase application under 35 U.S.C. § 371 of PCT Application No. PCT/JP2020/036623 filed on Sep. 28, 2020, which claims the benefit of Japanese Patent Application No. 2019-186568 filed on Oct. 10, 2019, the entire disclosures of which are incorporated herein by reference.

TECHNICAL FIELD

The various aspects and exemplary embodiments described herein pertain generally to a bonding system and an inspection method of inspecting a combined substrate.

BACKGROUND

There is known a bonding system including a bonding device for forming a combined substrate by bonding substrates, such as semiconductor wafers, and an inspection device for inspecting the combined substrate formed by the bonding device (see Patent Document 1).
Patent Document 1: Japanese Patent Laid-open Publication No. 2011-187716

SUMMARY

In one exemplary embodiment, a bonding system includes a bonding device, an inspection device and a controller. The bonding device is configured to form a combined substrate by bonding a first substrate and a second substrate to each other. The inspection device is configured to inspect the combined substrate. The controller is configured to control the inspection device. Further, the controller includes a measurement controller, a comparison unit and a re-measurement controller. The measurement controller is configured to cause the inspection device to measure the combined substrate at a first number of measurement points. The comparison unit is configured to compare, with a reference, an inspection result including a deviation amount between the first substrate and the second substrate in the combined substrate based on a measurement result. The re-measurement controller is configured to cause the inspection device to re-measure the combined substrate at a second number of measurement points greater than the first number of measurement points based on a comparison result obtained by the comparison unit.

DETAILED DESCRIPTION

Figure 1:
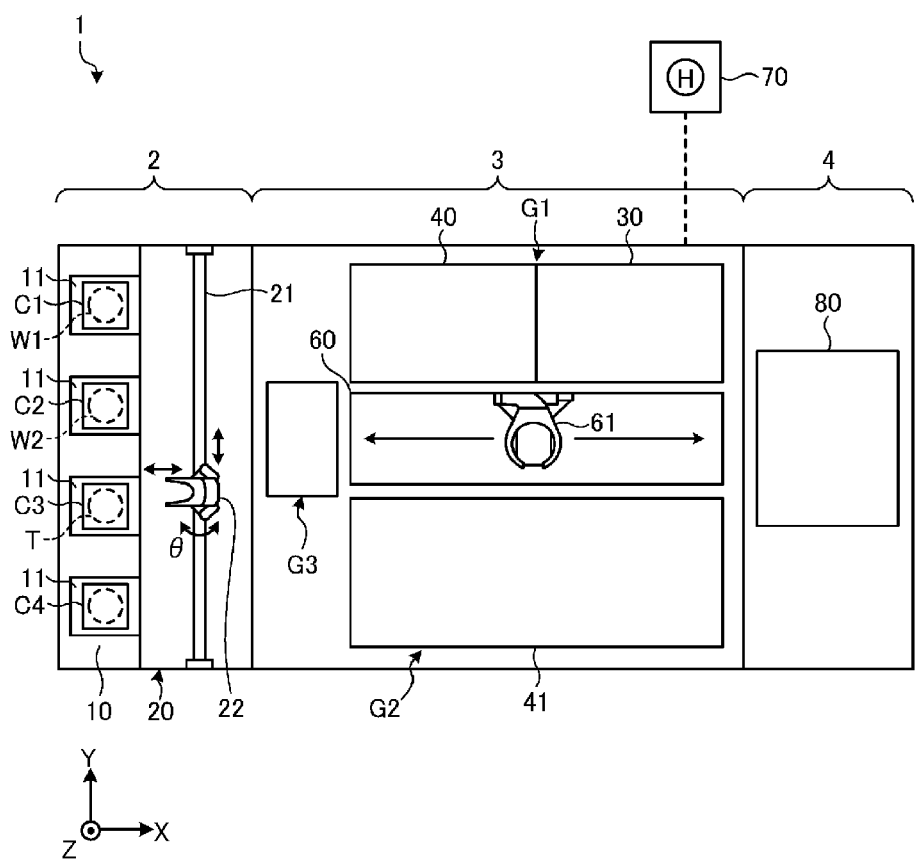
FIG. 1 is a schematic diagram showing a configuration of a bonding system according to an exemplary embodiment.

Hereinafter, embodiments for a bonding system and a method for inspecting a combined substrate according to the present disclosure (hereinafter, referred to as "exemplary embodiments") will be described in detail with reference to the accompanying drawings. Further, it should be noted that the bonding system and the method for inspecting a combined substrate according to the present disclosure are not limited by the exemplary embodiments. Further, unless processing contents are contradictory, the exemplary embodiments can be appropriately combined. Furthermore, in the exemplary embodiments to be described below, same parts will be assigned same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Moreover, in the accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Further, a rotational direction around a vertical axis may be referred to as "θ direction."

<Configuration of Bonding System>
First, a configuration of a boding system according to an exemplary embodiment will be described with reference to FIG. 1 and FIG. 2. FIG. 1 is a schematic diagram showing a configuration of a bonding system according to the exemplary embodiment. Also, FIG. 2 is a schematic diagram showing a state of a first substrate and a second substrate before they are bonded according to the exemplary embodiment.

Figure 2:
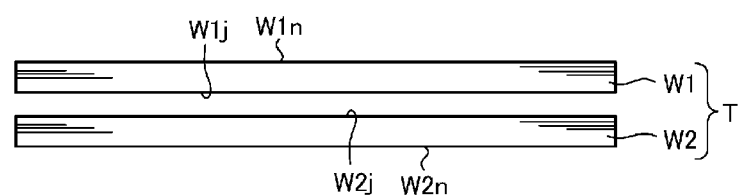
FIG. 2 is a schematic diagram showing a state of a first substrate and a second substrate before they are bonded according to the exemplary embodiment.

A bonding system 1 shown in FIG. 1 forms a combined substrate T by bonding a first substrate W1 and a second substrate W2 with each other (see FIG. 2).

The first substrate W1 and the second substrate W2 are, for example, substrates in which a plurality of electronic circuits is formed on a semiconductor substrate such as a silicon wafer or a compound semiconductor wafer. The first substrate W1 and the second substrate W2 have approximately the same diameter. Further, either one of the first substrate W1 and the second substrate W2 may be, for example, a bare substrate on which no electronic circuit is formed.

In the following description, as shown in FIG. 2, among surfaces of the first substrate W1, a surface to be bonded to the second substrate W2 will be referred to as "bonding surface W1$j$," and a surface opposite the bonding surface W1$j$ will be referred to as "non-bonding surface W1$n$." Further, among surfaces of the second substrate W2, a surface to be bonded to the first substrate W1 will be referred to as "bonding surface W2$j$," and a surface opposite the bonding surface W2$j$ will be referred to as "non-bonding surface W2$n$."

As depicted in FIG. 1, the bonding system 1 includes a carry-in/out station 2, a processing station 3 and an inspection station 4. The carry-in/out station 2 is placed on the negative X-axis side of the processing station 3 and integrally connected to the processing station 3. Further, the inspection station 4 is placed on the positive X-axis side of the processing station 3 and integrally connected to the processing station 3.

The carry-in/out station 2 includes a placing table 10 and a transfer section 20. The placing table 10 is equipped with a plurality of placing plates 11. Respectively provided on the placing plates 11 are cassettes C1 to C4 each of which accommodates therein a plurality of (e.g., 25) substrates horizontally. The cassette C1 accommodates therein a plurality of first substrates W1; the cassette C2, a plurality of second substrates W2; and the cassette C3, a plurality of combined substrates T. The cassette C4 is, for example, a cassette for collecting a problematic substrate. Further, the number of the cassettes C1 to C4 placed on the placing plates 11 is not limited to the illustrated example.

The transfer section 20 is provided adjacent to the positive X-axis side of the placing table 10. The transfer section 20 is provided with a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis. The transfer device 22 is also configured to transfer the first substrates W1, the second substrates W2 and the combined substrates T between the cassettes C1 to C4 placed on the placing plates 11 and a third processing block G3 of the processing station 3 to be described later.

The processing station 3 is provided with, for example, three processing blocks G1, G2 and G3. The first processing block G1 is placed on the rear side of the processing station 3 (positive Y-axis side of FIG. 1). The second processing block G2 is placed on the front side of the processing station 3 (negative Y-axis side of FIG. 1). Further, the third processing block G3 is placed on the carry-in/out station 2 side of the processing station 3 (negative X-axis side of FIG. 1).

Provided in the first processing block G1 is a surface modifying device 30 configured to modify the bonding surfaces W1$j$ and W2$j$ of the first substrate W1 and the second substrate W2. The surface modifying device 30 cuts the bonds of $SiO_2$ on the bonding surfaces W1$j$ and W2$j$ of the first substrate W1 and the second substrate W2 to form single-bond SiO, thereby modifying the bonding surfaces W1$j$ and W2$j$ such that the bonding surfaces W1$j$ and W2$j$ can be subsequently hydrophilized with ease.

Specifically, in the surface modifying device 30, an oxygen gas or a nitrogen gas as a processing gas is excited into plasma to be ionized under, for example, a compressed atmosphere. As oxygen ions or nitrogen ions are radiated to the bonding surfaces W1$j$ and W2$j$ of the first substrate W1 and the second substrate W2, the bonding surfaces W1$j$ and W2$j$ are plasma-processed to be modified.

Further, in the first processing block G1, a surface hydrophilizing device 40 is placed. The surface hydrophilizing device 40 is configured to hydrophilize and clean the bonding surfaces W1$j$ and W2$j$ of the first substrate W1 and the second substrate W2 with, for example, pure water. Specifically, the surface hydrophilizing device 40 supplies the pure water onto the first substrate W1 or the second substrate W2 while rotating the first substrate W1 or the second substrate W2 held by, for example, a spin chuck. Accordingly, the pure water supplied onto the first substrate W1 or the second substrate W2 is diffused on the bonding surface W1$j$ of the first substrate W1 or the bonding surface W2$j$ of the second substrate W2, and, thus, the bonding surface W1$j$ or W2$j$ are hydrophilized.

Here, although the surface modifying device 30 and the surface hydrophilizing device 40 are placed side by side, the surface hydrophilizing device 40 may be stacked on top of the surface modifying device 30.

In the second processing block G2, a bonding device 41 is placed. The bonding device 41 is configured to bond the first substrate W1 and the second substrate W2, which have been hydrophilized, by an intermolecular force. A configuration of the bonding device 41 will be described later.

A transfer section 60 is formed in a region surrounded by the first processing block G1, the second processing block G2 and the third processing block G3. A transfer device 61 is placed in the transfer section 60. The transfer device 61 is equipped with, for example, a transfer arm configured to be movable in the vertical direction and the horizontal direction and pivotable around a vertical axis. The transfer device 61 moves within the transfer section 60 and transfers the first substrates W1, the second substrates W2 and the combined substrates T to predetermined devices within the first processing block G1, the second processing block G2 and the third processing block G3 which are adjacent to the transfer section 60.

In the inspection station 4, an inspection device 80 is provided. The inspection device 80 is configured to inspect the combined substrates T formed by the bonding device 41.

Also, the bonding system 1 includes a control device 70. The control device 70 controls an operation of the bonding system 1. A configuration of the control device 70 will be described later.

<Configuration of Bonding Device>

Figure 3:
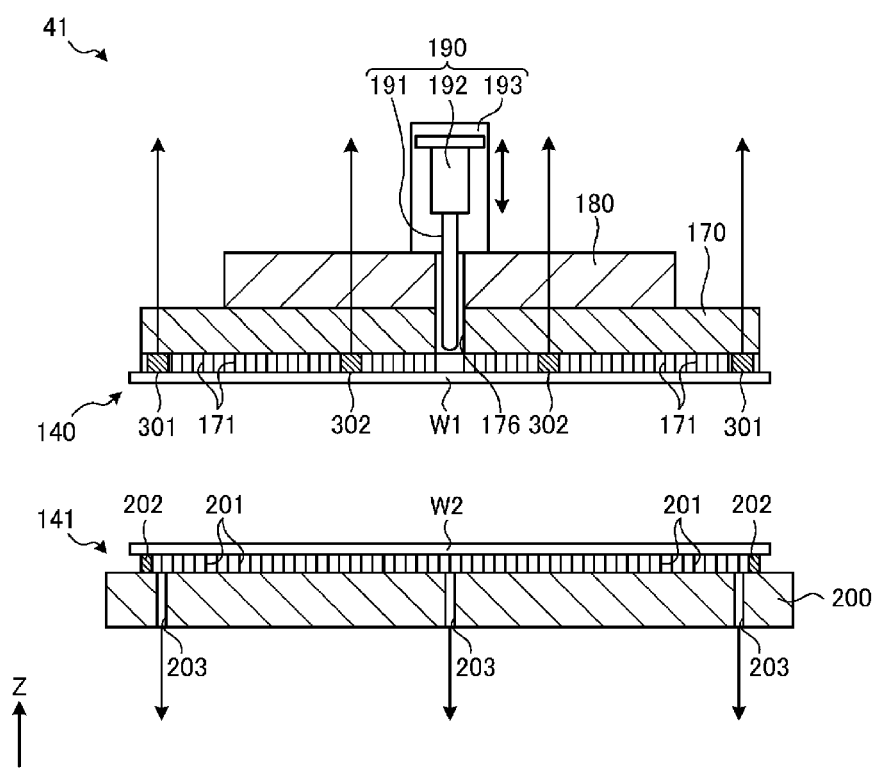
FIG. 3 is a schematic diagram showing a configuration of a bonding device according to the exemplary embodiment.

Hereinafter, the configuration of the bonding device 41 will be described with reference to FIG. 3. FIG. 3 is a schematic diagram showing the configuration of the bonding device 41 according to the exemplary embodiment.

As shown in FIG. 3, the bonding device 41 includes a first holder 140, a second holder 141 and a striker 190.

The first holder 140 has a main body 170. The main body 170 is supported by a supporting member 180. A through-hole 176 penetrating the supporting member 180 and the main body 170 in the vertical direction is formed through the supporting member 180 and the main body 170. The position of the through-hole 176 corresponds to a central portion of the first substrate W1 attracted and held by the first holder 140. A pressing pin 191 of the striker 190 is inserted into the through-hole 176.

The striker 190 is placed on a top surface of the supporting member 180, and is equipped with the pressing pin 191, an actuator 192 and a linearly moving mechanism 193. The pressing pin 191 is a cylindrical member extending in the vertical direction and is supported by the actuator 192.

The actuator 192 is configured to generate a constant pressure in a predetermined direction (here, vertically downward direction) by air supplied via, for example, an electro-pneumatic regulator (not shown). By the air supplied via the electro-pneumatic regulator, the pressing pin 191 can be brought into contact with the central portion of the first substrate W1 and can control a pressing load applied to the central portion of the first substrate W1. Further, a tip end of the pressing pin 191 is inserted into the through-hole 176 by the air from the electro-pneumatic regulator and is movable in the vertical direction.

The actuator 192 is supported by the linearly moving mechanism 193. The linearly moving mechanism 193 is configured to move the actuator 192 in the vertical direction by, for example, a driving unit having a built-in motor.

The striker 190 controls the pressing load applied to the first substrate W1 from the pressing pin 191 of the actuator 192 by controlling the movement of the actuator 192 with the linearly moving mechanism 193. Thus, the striker 190 brings the first substrate W1 attracted to and held by the first holder 140 into contact with the second substrate W2 by pressing the central portion of the first substrate W1.

A plurality of pins 171 in contact with a top surface (the non-bonding surface W1$n$) of the first substrate W1 is formed in a bottom surface of the main body 170. For example, each of the plurality of pins 171 has a diameter of 0.1 mm to 1 mm and a height of several tens of μm to several hundreds of μm. The pins 171 are uniformly arranged at an interval of, for example, 2 mm.

The first holder 140 includes a plurality of attraction units configured to attract the first substrate W1 in a part of a region where the plurality of pins 171 is formed. Specifically, a plurality of outer attraction units 301 and a plurality of inner attraction units 302 configured to attract the first substrate W1 by evacuation are provided in the bottom surface of the main body 170 in the first holder 140. The plurality of outer attraction units 301 and the plurality of inner attraction units 302 have a circular arc-shaped attraction region when viewed from the top. The plurality of outer attraction units 301 and the plurality of inner attraction units 302 have the same height as the pins 171.

The plurality of outer attraction units 301 is placed in an outer peripheral portion of the main body 170. The plurality of outer attraction units 301 is connected to a non-illustrated suction device such as a vacuum pump or the like, and attracts an outer peripheral portion of the first substrate W1 by the evacuation.

The plurality of inner attraction units 302 is placed on the diametrically inner side of the main body 170 than the plurality of outer attraction units 301 along a circumferential direction. The plurality of inner attraction units 302 is connected to a non-illustrated suction device such as a vacuum pump or the like, and attracts a region between the outer peripheral portion and the central portion of the first substrate W1 by the evacuation.

The second holder 141 will be described. The second holder 141 has a main body 200 having a diameter equal to or greater than that of the second substrate W2. Herein, the second holder 141 is illustrated as having a greater diameter than the second substrate W2. A top surface of the main body 200 is a facing surface that faces a bottom surface (the non-bonding surface W2$n$) of the second substrate W2.

A plurality of pins 201 in contact with the bottom surface (the non-bonding surface W2$n$) of the second substrate W2 is formed in the top surface of the main body 200. For example, each of the plurality of pins 201 has a diameter of 0.1 mm to 1 mm and a height of several tens of μm to several hundreds of μm. The pins 201 are uniformly arranged at an interval of, for example, 2 mm.

Also, a lower rib 202 is annularly provided outside the plurality of pins 201 on the top surface of the main body 200. The lower rib 202 is annularly formed and supports an outer peripheral portion of the second substrate W2 along the entire circumference.

Also, the main body 200 has a plurality of lower suction ports 203. The plurality of lower suction ports 203 is provided in an attraction region surrounded by the lower rib 202. The plurality of lower suction ports 203 is connected to a non-illustrated suction device, such as a vacuum pump or the like, via a non-illustrated suction pipe.

The second holder 141 is configured to compress the attraction region surrounded by the lower rib 202 while evacuating the attraction region from the plurality of lower suction ports 203. As a result, the second substrate W2 placed in the attraction region is attracted and held by the second holder 141.

Since the lower rib 202 supports the outer peripheral portion of the bottom surface of the second substrate W2 along the entire circumference, the second substrate W2 is appropriately evacuated to the outer peripheral portion of the second substrate W2. Thus, the entire surface of the second substrate W2 can be attracted and held. Further, since the bottom surface of the second substrate W2 is supported by the plurality of pins 201, the second substrate W2 can be easily separated from the second holder 141 when the evacuation of the second substrate W2 is released.

Although not illustrated in the drawings, the bonding device 41 may be further provided with a transition, an inverting mechanism and a position adjusting mechanism at a front end of the first holder 140 or the second holder 141 shown in FIG. 3. The transition temporarily accommodates therein the first substrate W1, the second substrate W2 and the combined substrates T. The position adjusting mechanism adjusts the horizontal orientations of the first substrate W1 and the second substrate W2. The inverting mechanism inverts a front surface and a rear surface of the first substrate W1.

<Configuration of Inspection Device>

Figure 4:
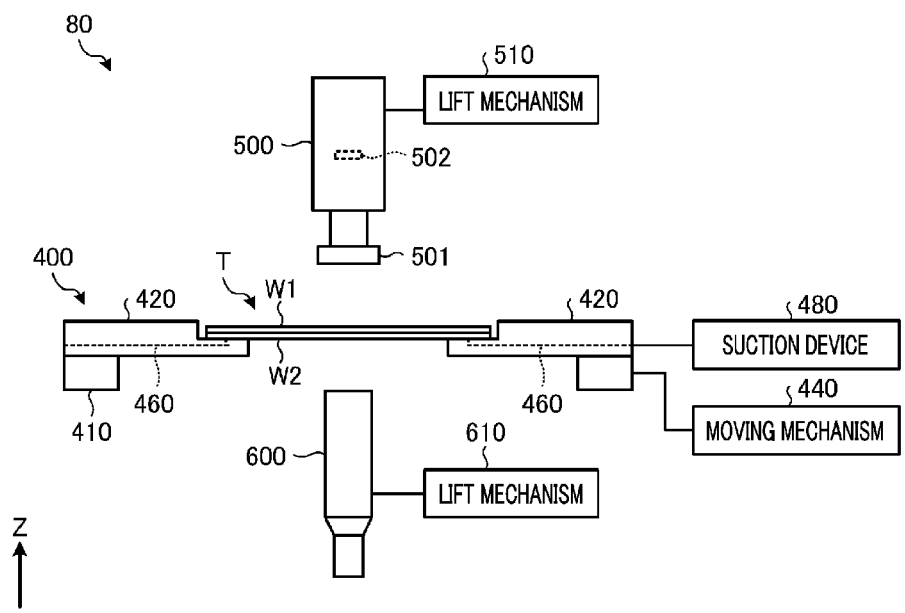
FIG. 4 is a schematic diagram showing a configuration of an inspection device according to the exemplary embodiment.
Figure 5:
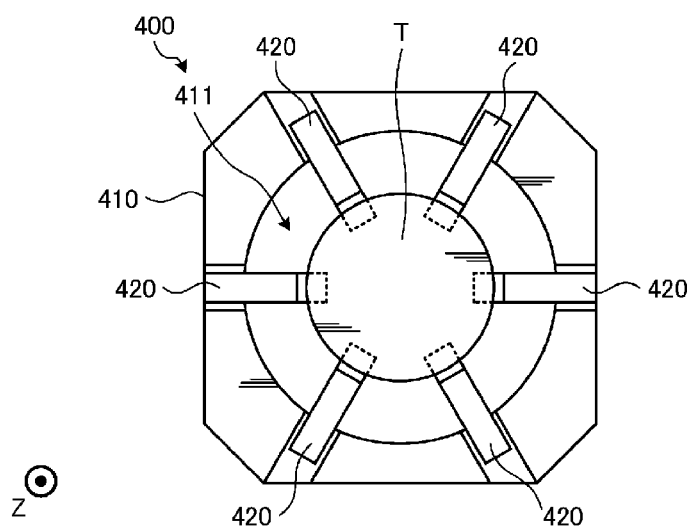
FIG. 5 is a schematic diagram showing a configuration of a holder of the inspection device according to the exemplary embodiment.

Hereinafter, a configuration of an inspection device will be described with reference to FIG. 4 and FIG. 5. FIG. 4 is a schematic diagram showing a configuration of an inspection device according to the exemplary embodiment. Also, FIG. 5 is a schematic diagram showing a configuration of a holder of the inspection device according to the exemplary embodiment. FIG. 4 is a side view of the inspection device, and FIG. 5 is a top view of the holder of the inspection device.

As shown in FIG. 4, the inspection device 80 includes a holder 400, an imaging unit 500 and an illumination unit 600.

As shown in FIG. 4 and FIG. 5, the holder 400 horizontally holds a combined substrate T. The holder 400 has a main body 410 and a plurality of supporting members 420.

The main body 410 is a flat plate-shaped member with an opening 411 having a greater diameter than the combined substrate T. The main body 410 is connected to a moving mechanism 440, and is movable in the horizontal direction (X-axis direction and Y-axis direction) and pivotable around a vertical axis by the moving mechanism 440.

The plurality of supporting members 420 is provided on the main body 410 so as to extend toward the center of the opening 411. An outer peripheral portion of the combined substrate T is supported by tip ends of the plurality of supporting members 420. The tip ends of the plurality of supporting members 420 are connected to a suction device 480, such as a vacuum pump or the like, via a suction pipe 460, and attract the outer peripheral portion of the bottom surface of the combined substrate T by evacuation.

The imaging unit 500 is located above the holder 400. The imaging unit 500 is equipped with a camera lens 501 and an imaging device 502 such as a CCD image sensor or a CMOS image sensor. The imaging unit 500 may be connected to a lift mechanism 510 and moved up and down by the lift mechanism 510 to adjust a distance from the top surface (i.e., the top surface of the first substrate W1) of the combined substrate T.

The illumination unit 600 is located under the holder 400. Specifically, the illumination unit 600 is located to face the imaging unit 500 with the combined substrate T held by the holder 400 therebetween. The illumination unit 600 is configured to radiate light vertically upwards from below the combined substrate T held by the holder 400. For example, the illumination unit 600 radiates near-infrared light of 1000 nm to 1200 nm. The illumination unit 600 may be connected to a lift mechanism 610 and moved up and down by the lift mechanism 610 to adjust a distance from the bottom surface (i.e., the bottom surface of the second substrate W2) of the combined substrate T.

Also, the inspection device 80 may be equipped with a plurality of imaging units having different magnifications. For example, the inspection device 80 may be equipped with a macro imaging unit and a micro imaging unit. In this case, the inspection device 80 may be equipped with respective illumination units at a position facing the macro imaging unit and a position facing the micro imaging unit.

Figure 6:
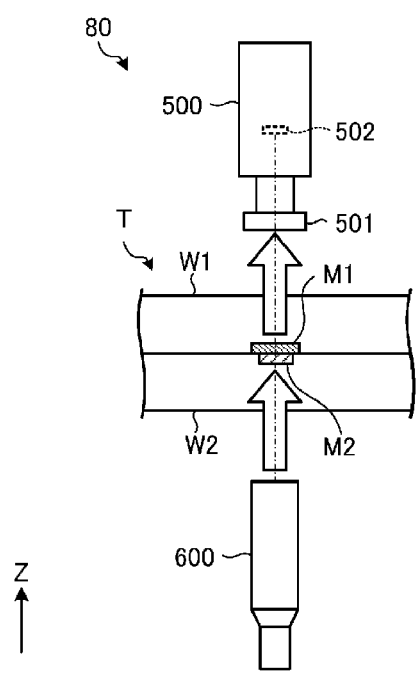
FIG. 6 is a diagram illustrating an example of a method of imaging a measurement mark.

The inspection device 80 is configured as described above, and images measurement marks formed in the first substrate W1 and the second substrate W2, respectively. FIG. 6 is a diagram illustrating an example of an inspection method of imaging a measurement mark. Also, FIG. 7 is a diagram illustrating an example of the measurement mark.

As shown in FIG. 6, the inspection device 80 radiates the light vertically upwards from the illumination unit 600. The light radiated from the illumination unit 600 reaches the imaging device 502 of the imaging unit 500 via the second substrate W2 and the first substrate W1. That is, the imaging unit 500 images the combined substrate T using the light transmitted through the combined substrate T. Specifically, measurement marks M1 and M2 are formed in the first substrate W1 and the second substrate W2, respectively, and the imaging unit 500 images the measurement marks M1 and M2. Image data acquired by the imaging unit 500 are output to the control device 70.

Figure 7:
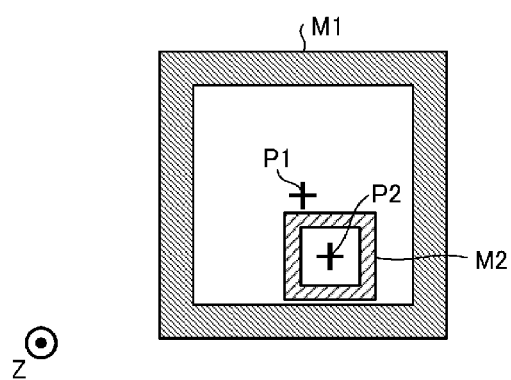
FIG. 7 is a diagram illustrating an example of the measurement mark.

As shown in FIG. 7, the image data include an image of the measurement mark M1 formed in the first substrate W1 and an image of the measurement mark M2 formed in the second substrate W2. The control device 70 analyzes the image data to acquire measurement results, such as the coordinates of central points P1 and P2 of the measurement marks M1 and M2 and the deviation amounts of the central points P1 and P2, and inspects a bonding state of the combined substrate T based on the acquired measurement results.

<Configuration of Control Device>

Figure 8:
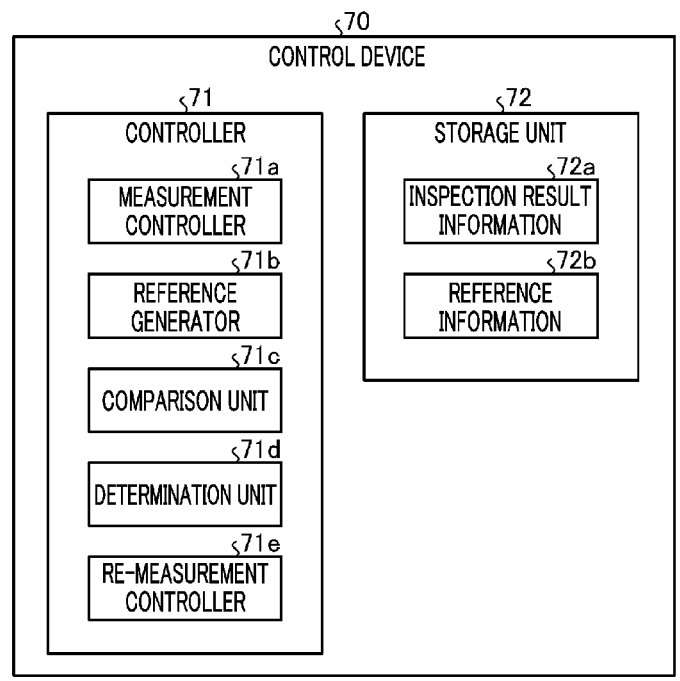
FIG. 8 is a block diagram showing a configuration of a control device according to the exemplary embodiment.

Hereinafter, the configuration of the control device 70 will be described with reference to FIG. 8. FIG. 8 is a block diagram showing a configuration of the control device 70 according to the exemplary embodiment. Also, FIG. 8 illustrates the components related to the inspection device 80 among the components included in the control device 70.

As shown in FIG. 8, the control device 70 includes a controller 71 and a storage unit 72. The controller 71 includes a measurement controller 71a, a reference generator 71b, a comparison unit 71c, a determination unit 71d and a re-measurement controller 71e. Also, the storage unit 72 stores therein inspection result information 72a and reference information 72b.

Further, the control device 70 includes a computer having a CPU (Central Processing Unit), a ROM (Read Only Memory), a RAM (Random Access Memory), a HDD (Hard Disk Drive) and an input/output port, etc., and various circuits.

For example, the CPU of the computer reads out programs stored in the ROM so as to function as the measurement controller 71a, the reference generator 71b, the comparison unit 71c, the determination unit 71d and the re-measurement controller 71e of the controller 71. Also, at least one or all of the measurement controller 71a, the reference generator 71b, the comparison unit 71c, the determination unit 71d and the re-measurement controller 71e may be configured by hardware such as an ASIC (Application Specific Integrated Circuit), a GPU (Graphics Processing Unit) or an FPGA (Field Programmable Gate Array).

The storage unit 72 corresponds to, for example, the RAM and the HDD. The RAM and the HDD may store therein the inspection result information 72a and the reference information 72b. Further, the control device 70 may acquire the programs described above and various kinds of information via another computer or a portable storage medium connected through a wired or wireless network.

(Measurement Controller)

Figure 9:
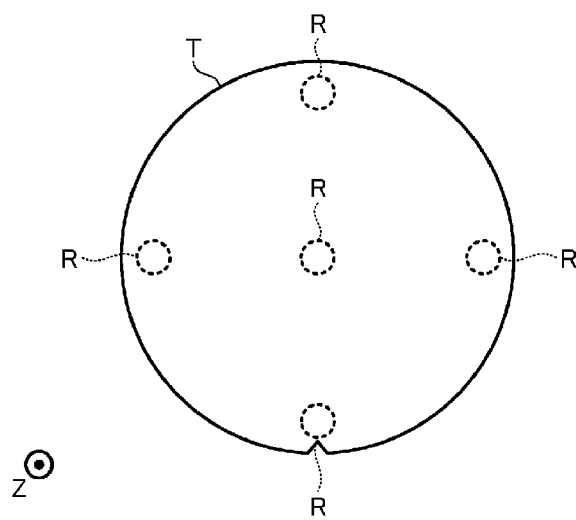
FIG. 9 is a diagram illustrating an example of measurement points set for a measurement processing.

The measurement controller 71a sets a first number of measurement points on the combined substrate T, and causes the inspection device 80 to measure the combined substrate T at each of the measurement points. FIG. 9 is a diagram illustrating an example of measurement points set for a measurement processing.

As shown in FIG. 9, the measurement controller 71a sets a total of five measurement points R including four measurement points R at the outer peripheral portion of the combined substrate T and one measurement point R at the central portion on the combined substrate T according to the exemplary embodiment. That is, in the present exemplary embodiment, the first number of measurement points is five.

The four measurement points R set at the outer peripheral portion are equally spaced, i.e., arranged at an interval of 90°. In other words, the five measurement points R including the measurement point R set at the central portion are set on the combined substrate T so as to be rotationally symmetric (here, four-fold rotationally symmetric). Thus, poor bonding caused by inclination of the first holder 140 or the second holder 141 of the bonding device 41 can be appropriately detected as compared to, for example, a case where a plurality of measurement points R is concentrated on specific places in the outer peripheral portion.

The measurement controller 71a acquires image data as a measurement result from the inspection device 80. Then, the measurement controller 71a derives an inspection result including the deviation amount between the first substrate W1 and the second substrate W2 in the combined substrate T based on the acquired image data. Specifically, the measurement controller 71a analyzes the image data to calculate the X-coordinate x1 and the Y-coordinate y1 of the measurement mark M1 and the X-coordinate x2 and the Y-coordinate y2 of the measurement mark M2 at each of the measurement points R. Also, the measurement controller 71a calculates the deviation amount Δx between the X-coordinates of the measurement marks M1 and M2 and the deviation amount Δy between the Y-coordinates of the measurement marks M1 and M2. Further, the measurement controller 71a substitutes the calculation results x1, y1, x2, y2, Δx, Δy for the first number of measurement points (herein, five points) into a calculation model prepared in advance.

In the calculation model, for example, the deviation amount of the first substrate W1 with respect to the second substrate W2 is decomposed into deviation in the X-axis direction (X-shift), deviation in the Y-axis direction (Y-shift), deviation in the rotational direction around the vertical axis (rotation) and deviation caused by expansion and contraction (scaling). The measurement controller 71a acquires inspection results for the above-described components by using the calculation model and stores the acquired inspection results as the inspection result information 72a in the storage unit 72.

(Reference Generator)

The reference generator 71b generates the reference information 72b. The reference information 72b includes reference values for the respective components of the deviation between the first substrate W1 and the second substrate W2.

The reference generator 71b generates the reference information 72b for the combined substrate T to be currently inspected (hereinafter, referred to as "inspection target substrate T") based on the inspection result for the combined substrate T which has already been inspected (hereinafter, referred to as "inspection completion substrate T").

Figure 10:
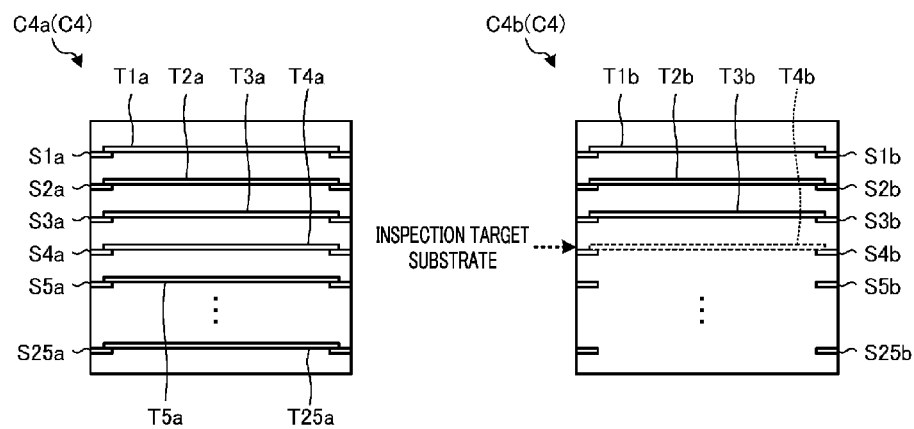
FIG. 10 is provided to explain an example of reference information.

FIG. 10 is provided to explain an example of the reference information 72b. As shown in FIG. 10, cassettes C4a and C4b have, for example, 25 slots S1a to S25a and S1b to S25b, respectively, and the combined substrate T can be loaded in each of the slots S1a to S25a and S1b to S25b. For example, in the cassette C4a, combined substrates T1a to T25a are loaded in the slots S1a to S25a, respectively.

The bonding system 1 performs a series of processings including a bonding processing by the bonding device 41 and an inspection processing by the inspection device 80 for each lot unit composed of a plurality of (herein, 25) combined substrates T loaded in the cassette C4.

The combined substrates T (i.e., the inspection completion substrates T) that have undergone a series of processings are loaded sequentially from the uppermost slot in the cassette C4. For example, among the combined substrates T1a to T25a in one lot, the first processed combined substrate T1a is loaded in the uppermost slot S1a of the cassette C4a and the subsequently processed combined substrate T2a is loaded in the slot S2a located right under the slot S1a.

The reference generator 71b generates the reference information 72b for the inspection target substrate T based on the inspection results for one or more inspection completion substrates in the same lot as the inspection target substrate T. That is, for example, it is assumed that a combined substrate T4b to be loaded in the slot S4b of the cassette C4b is the inspection target substrate. In this case, the reference generator 71b generates the reference information 72b for the inspection target substrate T4b based on the inspection result for at least one of the inspection completion substrates T1b to T3b loaded in the slots S1b to S3b of the same cassette C4b.

For example, the reference generator 71b may generate, as the reference information 72b for the inspection target substrate T4b, an inspection result for the inspection completion combined substrate T1b, which is firstly processed, among the plurality of the inspection completion substrates T1b to T3b in the same lot. In this case, the reference information 72b can be commonly used for the plurality of combined substrates T in one lot except the combined substrate T1b, which is firstly processed. Thus, it is possible to reduce a processing load of the reference generator.

Also, in this case, the reference generator 71b may generate the reference information 72b for the combined substrate T1b based on, for example, an inspection result for a lot processed right before the lot including the combined substrate T1b. For example, the reference generator 71b may generate, as the reference information 72b, an inspection result for the inspection completion substrate T1a, which is firstly processed, among the plurality of inspection completion substrates T1a to T25a loaded in the cassette C4a. Further, the reference generator 71b may generate, as the reference information 72b for the combined substrate T1b, an average value of the inspection results for the plurality of inspection completion substrates T1a to T25a loaded in the cassette C4a.

Furthermore, the reference generator 71b may generate, as the reference information 72b for the inspection target substrate T, an average value of the inspection results for two or more inspection completion substrates T among the plurality of inspection completion substrates T in the same lot.

For example, the reference generator 71b may generate, as the reference information 72b for the inspection target substrate T4b, an average value of the inspection results for all the inspection completion substrates T1b to T3b in the same lot. Also, the reference generator 71b may generate, as the reference information 72b for the inspection target substrate T4b, an average value of the inspection results for two or more inspection completion substrates T (for example, inspection completion substrates T2b and T3b) including the inspection completion substrate T3b processed right before the inspection target substrate T4b. By using the average value of the inspection results for the combined substrates T in the same lot as the reference information 72b, the reliability of the reference information 72b can be improved.

The reference generator 71b may generate the reference information 72b based on inspection results for inspection completion substrates T not only in the same lot but also in a different lot. For example, the reference generator 71b may generate, as the reference information 72b for the inspection target substrate T, an inspection result for an inspection completion substrate T which is in a different lot from the inspection target substrate T and has been processed in the same order as the inspection target substrate T in the different lot. That is, the reference generator 71b may generate, as the reference information 72b for the inspection target substrate T4b, an inspection result for the inspection completion substrate T4a which is loaded in the slot S4a of the cassette C4a different from the cassette C4b where the inspection target substrate T4b is loaded.

The combined substrates T loaded in the same slots in different cassettes C4 are highly likely to be processed through the same route in the bonding system 1. That is, if a plurality of bonding devices 41 and a plurality of inspection devices 80 are provided in the bonding system 1, the combined substrates T loaded in the same slots in different cassettes C4 are highly likely to be transferred to the same bonding device 41 and the same inspection device 80. For this reason, the inspection results for the combined substrates T loaded in the same slots can be used as the reference information 72b, and, thus, the reliability of the reference information 72b can be improved.

As described above, the reference generator 71b generates the reference information 72b for the inspection target substrate T to be currently inspected based on the inspection result for the inspection completion substrate T which has been inspected before the inspection target substrate T is inspected.

(Comparison Unit)

The comparison unit 71c compares the inspection result information 72a with the reference information 72b stored in the storage unit 72. Specifically, the comparison unit 71c calculates a difference between a reference value and each of the components of the deviation (X-shift, Y-shift, rotation and scaling) between the first substrate W1 and the second substrate W2 included in the inspection result.

(Determination Unit)

Figure 11:
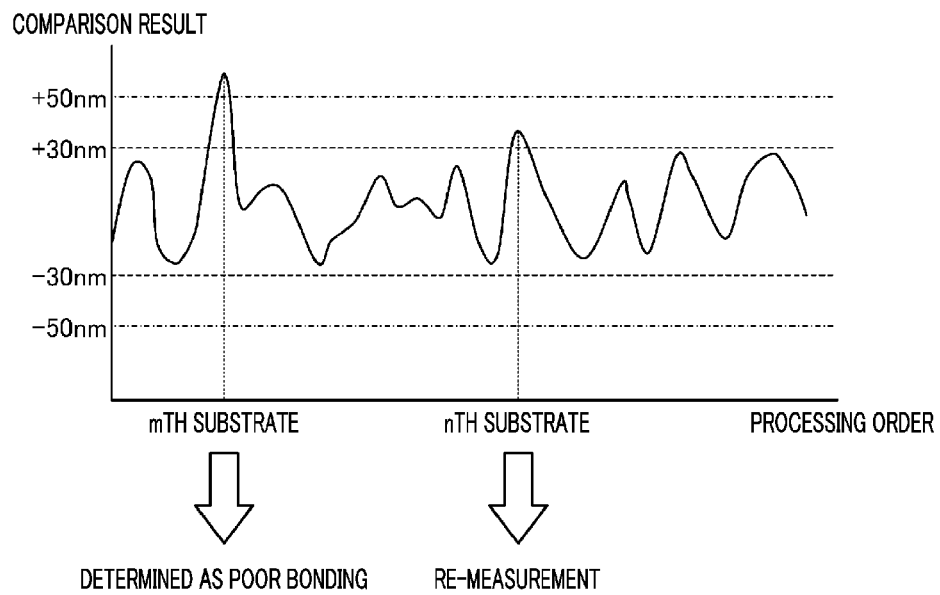
FIG. 11 is a diagram illustrating an example of a determination processing performed by a determination unit.

The determination unit 71d determines, based on the comparison result obtained by the comparison unit 71c, whether to re-measure the inspection target substrate T or whether the inspection target substrate T is poorly bonded. This will be described with reference to FIG. 11. FIG. 11 is a diagram illustrating an example of a determination processing performed by the determination unit 71d. Also, FIG. 11 shows a graph in which the horizontal axis is scaled by the processing order in one lot and the vertical axis is scaled by the comparison result obtained by the comparison unit 71c, i.e., the difference between the inspection result and the reference value. Further, FIG. 11 shows, for example, the comparison result for the component of X-shift.

As shown in FIG. 11, for example, it is assumed that a difference between an inspection result of X-shift and a reference value for an m-th combined substrate T exceeds a first threshold value, herein, a range of from −50 nm to +50 nm. In this case, the determination unit 71d determines that there is poor bonding between the first substrate W1 and the second substrate W2.

In this case, the controller 71 may generate, for example, poor bonding information in which the information indicating the poor bonding of the m-th combined substrate T is matched with an identification number of the m-th combined substrate T, and store the poor bonding information in the storage unit 72. Also, the controller 71 may transmit the generated poor bonding information to an external device through a network.

Also, it is assumed that a difference between an inspection result of X-shift and a reference value for an n-th combined substrate T exceeds a second threshold value, herein, a range of from −30 nm to +30 nm and does not exceed the first threshold value in the range of from −50 nm to +50 nm. In this case, the determination unit 71d determines that the inspection target substrate T will be re-measured.

(Re-Measurement Controller)

The re-measurement controller 71e causes the inspection device 80 to re-measure the inspection target substrate T depending on the determination result made by the determination unit 71d. Specifically, the re-measurement controller 71e causes the inspection device 80 to re-measure the inspection target substrate T at a second number of measurement points greater than the first number of measurement points set for the measurement processing by the measurement controller 71a.

Figure 12:
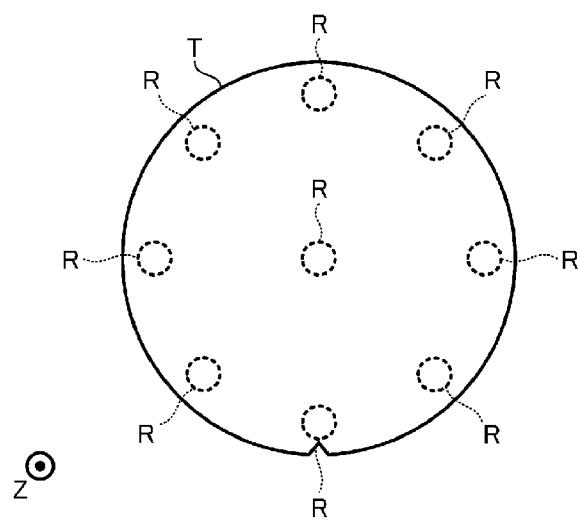
FIG. 12 is a diagram illustrating an example of measurement points set for a re-measurement processing.

FIG. 12 is a diagram illustrating an example of measurement points set for a re-measurement processing. As shown in FIG. 12, the re-measurement controller 71e sets a total of nine measurement points R including eight measurement points R at the outer peripheral portion of the combined substrate T and one measurement point R at the central portion on the combined substrate T. That is, in the present exemplary embodiment, the second number of measurement points is nine.

The measurement marks M1 and M2 are imaged at each measurement point R in the re-measurement processing in the same manner as in the measurement processing. The re-measurement controller 71e calculates the X-coordinate x1 and the Y-coordinate y1 of the measurement mark M1 and the X-coordinate x2 and the Y-coordinate y2 of the measurement mark M2 based on image data acquired in the re-measurement processing. Also, the re-measurement controller 71e calculates the deviation amount Δx between the X-coordinates of the measurement marks M1 and M2 and the deviation amount Δy between the Y-coordinates of the measurement marks M1 and M2. Further, the re-measurement controller 71e substitutes the calculation results x1, y1, x2, y2, Δx, Δy for the second number of measurement points (herein, nine points) into the calculation model prepared in advance. Accordingly, the re-measurement controller 71e acquires an inspection result for each of the components of the deviation of the first substrate W1 with respect to the second substrate W2 and stores the acquired inspection results as the inspection result information 72a in the storage unit 72.

As described above, the inspection device 80 images the measurement marks M1 and M2 using the light transmitted through the combined substrate T, but since it is difficult to obtain a sufficient light amount from the transmitted light, an exposure time for the imaging unit 500 tends to be set long. Therefore, as the number of measurement points increases, the time required to measure a single combined substrate T increases, which may causes a decrease in throughput. In this regard, it is considered to suppress the decrease in throughput by reducing the number of measurement points. However, as the number of measurement points decreases, the accuracy of the measurement processing may decrease.

Accordingly, in the bonding system 1 according to the exemplary embodiment, the measurement processing is performed at a relatively small number of measurement points, and when the inspection result acquired in the measurement processing deviates from the reference information 72b, the re-measurement processing is performed at an increased number of measurement points. Thus, it is possible to improve the throughput while securing the measurement accuracy of the inspection device 80.

<Specific Operation of Bonding System>

Figure 13:
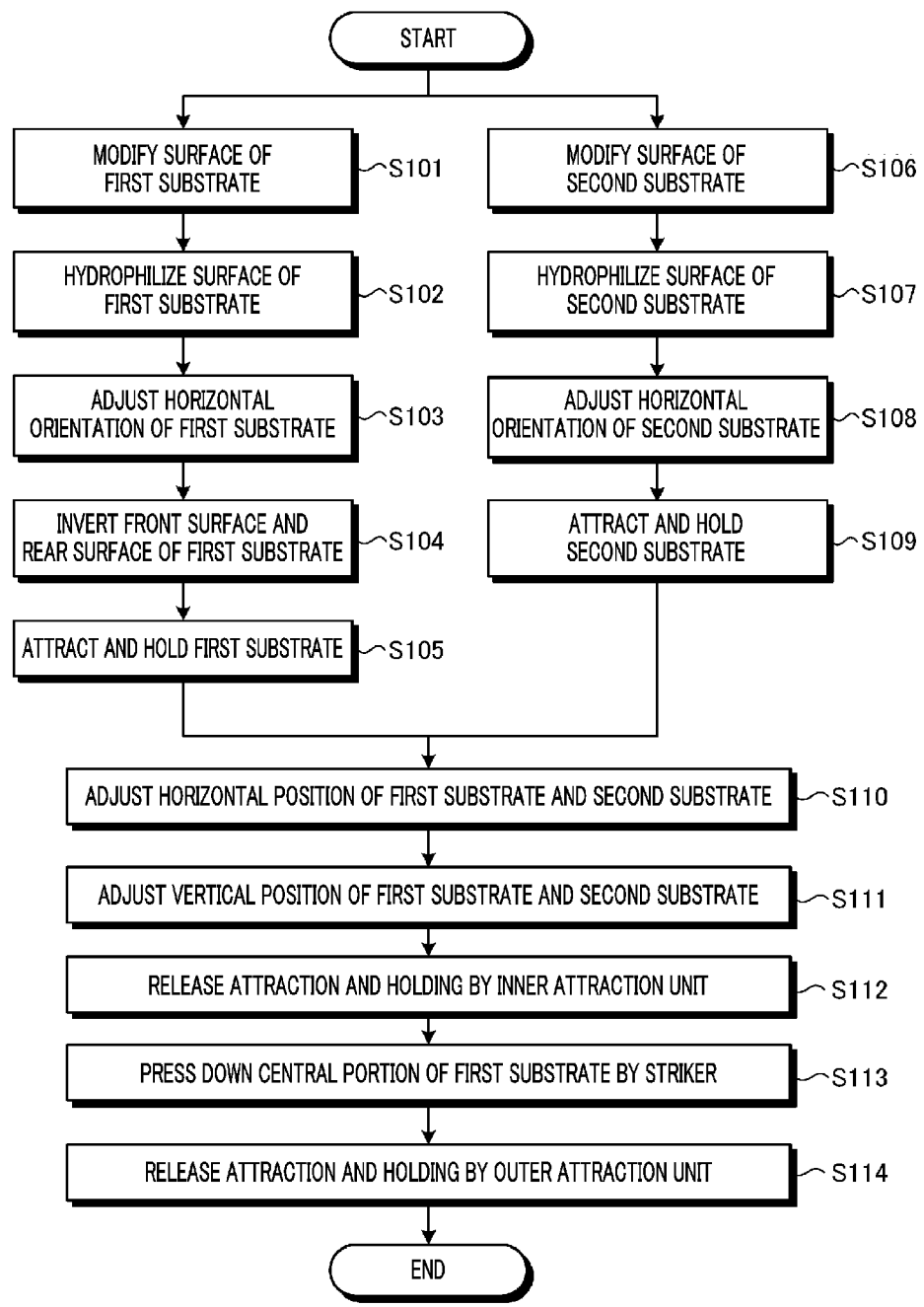
FIG. 13 is a flowchart showing an example of a sequence of processings performed by the bonding system until a combined substrate is formed by the bonding device.

Hereinafter, a specific operation of the bonding system 1 will be described. First, a sequence of processings of forming the combined substrate T by the bonding device 41 will be described with reference to FIG. 13. FIG. 13 is a flowchart showing an example of a sequence of processings performed by the bonding system 1 until the combined substrate T is formed by the bonding device 41. The various processings shown in FIG. 13 are performed under the control of the control device 70.

First, a cassette C1 accommodating a plurality of first substrates W1, a cassette C2 accommodating a plurality of second substrates W2 and an empty cassette C3 are respectively placed on predetermined placing plates 11 of the carry-in/out station 2. Thereafter, the first substrate W1 in the cassette C1 is taken out by the transfer device 22 and transferred to a transition device placed in the third processing block G3.

Then, the first substrate W1 is transferred to the surface modifying device 30 of the first processing block G1 by the transfer device 61. In the surface modifying device 30, the oxygen gas as the process gas is excited into plasma to be ionized under a predetermined compressed atmosphere. The oxygen ions are radiated onto the bonding surface of the first substrate W1 and the bonding surface is plasma-processed. As a result, the bonding surface of the first substrate W1 is modified (process S101).

Subsequently, the first substrate W1 is transferred to the surface hydrophilizing device 40 of the first processing block G1 by the transfer device 61. In the surface hydrophilizing device 40, the pure water is supplied onto the first substrate W1 while the first substrate W1 held by the spin chuck is rotated. Thus, the bonding surface of the first substrate W1 is hydrophilized. Also, the bonding surface of the first substrate W1 is cleaned with the pure water (process S102).

Thereafter, the first substrate W1 is transferred to the bonding device 41 of the second processing block G2 by the transfer device 61. The first substrate W1 carried into the bonding device 41 is transferred to the position adjusting mechanism via the transition, and the horizontal orientation of the first substrate W1 is adjusted by the position adjusting mechanism (process S103).

Subsequently, the first substrate W1 is delivered from the position adjusting mechanism to the inverting mechanism, and then the front surface and the rear surface of the first substrate W1 are inverted by the inverting mechanism (process S104). Specifically, the bonding surface W1*j* of the first substrate W1 is directed downwards.

Then, the first substrate W1 is delivered from the inverting mechanism to the first holder 140. The first substrate W1 with a notch oriented in a predetermined direction is attracted and held by the first holder 140 (process S105).

The second substrate W2 is processed while the processes S101 to S105 are being performed to the first substrate W1. First, the second substrate W2 in the cassette C2 is taken out by the transfer device 22 and transferred to the transition device placed in the third processing block G3.

Then, the second substrate W2 is transferred to the surface modifying device 30 by the transfer device 61, and the bonding surface W2*j* of the second substrate W2 is modified (process S106). Subsequently, the second substrate W2 is transferred to the surface hydrophilizing device 40 by the transfer device 61, and the bonding surface W2*j* of the second substrate W2 is hydrophilized and also cleaned (process S107).

Thereafter, the second substrate W2 is transferred to the bonding device 41 by the transfer device 61. The second substrate W2 carried into the bonding device 41 is transferred to the position adjusting mechanism via the transition. Further, the horizontal orientation of the second substrate W2 is adjusted by the position adjusting mechanism (process S108).

Subsequently, the second substrate W2 is transferred to the second holder 141, and the second substrate W2 with a notch oriented in a predetermined direction is attracted and held by the second holder 141 (process S109).

Then, the horizontal positions of the first substrate W1 held by the first holder 140 and the second substrate W2 held by the second holder 141 are adjusted (process S110).

Thereafter, the vertical positions of the first substrate W1 held by the first holder 140 and the second substrate W2 held by the second holder 141 are adjusted (process S111). Specifically, a first moving unit (not shown) moves the second holder 141 vertically upwards to allow the second substrate W2 to approach the first substrate W1.

Then, after the attraction and holding of the first substrate W1 by the plurality of inner attraction units 302 is released (process S212), the pressing pin 191 of the striker 190 is moved downwards so that the central portion of the first substrate W1 is pressed down (process S113).

When the central portion of the first substrate W1 is brought into contact with the central portion of the second substrate W2 and the central portion of the first substrate W1 and the central portion of the second substrate W2 are pressed against each other by the striker 190 with a predetermined force, the bonding is started between the pressed central portions of the first substrate W1 and the second substrate W2. That is, since the bonding surface W1*j* of the first substrate W1 and the bonding surface W2*j* of the second substrate W2 are modified in the processes S101 and S106, respectively, a Van der Waals force (intermolecular force) is generated between the bonding surfaces W1*j* and W2*j*, and, thus, the bonding surfaces W1*j* and W2*j* are bonded to each other. Also, since the bonding surface W1*j* of the first substrate W1 and the bonding surface W2*j* of the second substrate W2 are hydrophilized in the processes S102 and S107, respectively, hydrophilic groups between the bonding surfaces W1*j* and W2*j* are hydrogen-bonded, and, thus, the bonding surfaces W1*j* and W2*j* are firmly bonded to each other. As a result, a bonding region is formed.

Then, a bonding wave by which the bonding region spreads from the central portions toward the outer peripheral portions of the first substrate W1 and the second substrate W2 is generated between the first substrate W1 and the second substrate W2. Thereafter, the attraction and holding of the first substrate W1 by the plurality of outer attraction units 301 is released (process S114). Thus, the outer peripheral portion of the first substrate W1 attracted and held by the outer attraction units 301 drops down. As a result, the entire bonding surface W1*j* of the first substrate W1 is brought into contact with the entire bonding surface W2*j* of the second substrate W2 so as to form the combined substrate T.

Subsequently, the pressing pin 191 is moved upwards to the first holder 140, and the attraction and holding of the second substrate W2 by the second holder 141 is released. Then, the combined substrate T is taken out of the bonding device 41 by the transfer device 61. As a result, a series of bonding processings is completed.

Figure 14:
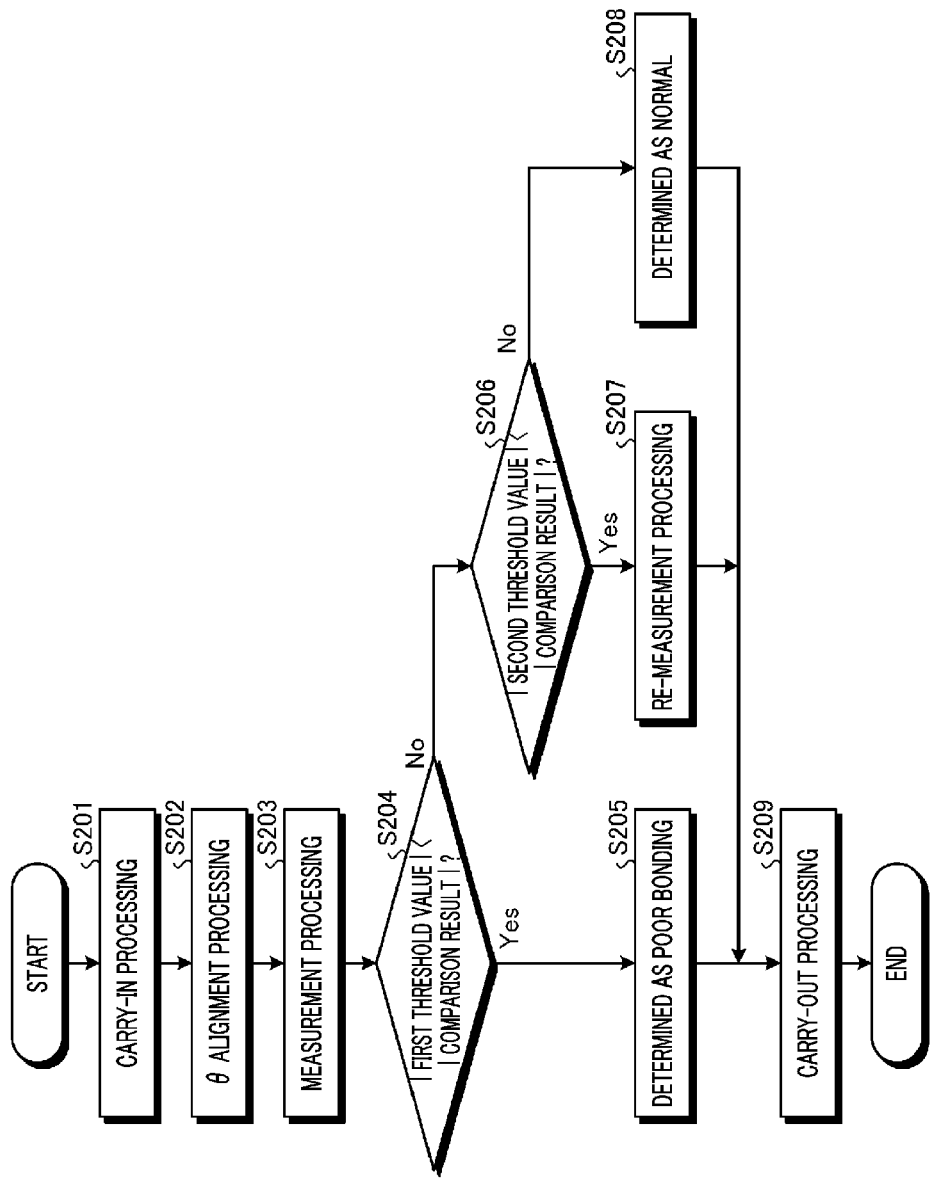
FIG. 14 is a flowchart showing an example of a sequence of an inspection processing.

Hereinafter, a sequence of an inspection processing by the inspection device 80 will be described with reference to FIG. 14. FIG. 14 is a flowchart showing an example of a sequence of the inspection processing.

First, as shown in FIG. 14, the inspection target substrate T is carried into the inspection device 80 (process S201). Specifically, the transfer device 61 (see FIG. 1) transfers the inspection target substrate T into the holder 400, and the inspection device 80 receives the inspection target substrate T from the transfer device 61 by using a non-illustrated lifter. Then, the lifter of the inspection device 80 is moved so that the inspection target substrate T is placed on the plurality of supporting members 420. Further, the suction device 480 evacuates the inspection target substrate T via the suction pipe 460 so that the inspection target substrate T is attracted and held by the holder 400.

Then, the inspection device 80 performs a θ alignment processing (process S202). The θ alignment processing is performed to adjust the position of the inspection target substrate T in the rotational direction. Specifically, in the inspection device 80, the imaging unit 500 images a plurality of reference points (e.g., a reference point located at a central portion of the inspection target substrate T and a reference point located next to the reference point) on the inspection target substrate T. Then, the inspection device 80 calculates a rotation angle of the inspection target substrate T from the obtained images, and rotates the inspection target substrate T by using the moving mechanism 440 such that the rotation angle becomes 0°. The reference point is formed on the first substrate W1 or the second substrate W2 together with a pattern for each shot when the pattern is formed on the first substrate W1 or the second substrate W2 by an exposure processing. That is, the inspection device 80 rotates the inspection target substrate T such that the pattern is arranged in the same direction for each shot of the inspection target substrate T.

Thereafter, the inspection device 80 performs the measurement processing (process S203). Specifically, in the inspection device 80, the moving mechanism 440 moves the holder 400 in the horizontal direction so that the imaging unit 500 and the illumination unit 600 are located on a vertical line of a first measurement point R. Subsequently, the inspection device 80 focuses the imaging unit 500 or corrects the position of the holder 400 and takes an image of the measurement marks M1 and M2 located at the first measurement point R by using the imaging unit 500 and the illumination unit 600.

The inspection device 80 performs the same processing for the other measurement points R. That is, the inspection device 80 repeats the above-described processings as many times as the first number of measurement points (herein, five). Further, the controller 71 calculates the components of the deviation, i.e., X-shift, Y-shift, rotation and scaling, of the first substrate W1 with respect to the second substrate W2 based on the obtained measurement results as many as the first number of measurement points (herein, five).

Then, the controller 71 determines whether the comparison result, i.e., the difference (absolute value) between each component of the deviation of the first substrate W1 with respect to the second substrate W2 and the reference value for each component included in the reference information 72b exceeds the first threshold value (absolute value) (process S204). When the comparison result (absolute value) for any one of the components exceeds the first threshold value (absolute value), the controller 71 determines that the comparison result (absolute value) exceeds the first threshold value (absolute value). When it is determined that the comparison result (absolute value) exceeds the first threshold value (absolute value) (process S204, Yes), the controller 71 determines that the inspection target substrate T is poorly bonded (process S205).

In the process S204, when the comparison result (absolute value) does not exceed the first threshold value (absolute value) (process S204, No), the controller 71 determines whether the comparison result (absolute value) exceeds the second threshold value (absolute value) (process S206). When it is determined that the comparison result (absolute value) exceeds the second threshold value (absolute value) (process S206, Yes), the controller 71 causes the inspection device 80 to perform the re-measurement processing to the inspection target substrate T. The re-measurement processing is performed at the second number of measurement points (herein, nine) greater than the first number of measurement points for the measurement processing in the process S203. Therefore, the accuracy of the measurement processing may be improved as compared to the measurement processing. In other words, it is possible to obtain the inspection result closer to the actual value than that obtained in the measurement processing.

In the process S206, when the comparison result (absolute value) does not exceed the second threshold value (absolute value) (process S206, No), the controller 71 determines that the inspection target substrate T is normally bonded (process S208).

After the processes S205, S207 and S208 are completed, the inspection target substrate T is carried out of the inspection device 80 (process S209). The carry-out processing is performed in reverse order to that of the carry-in processing in the process S201.

After the re-measurement processing in the process S207 is completed, the controller 71 may proceed to the process S204. In this case, if it is determined again in the process S206 that the comparison result (absolute value) exceeds the second threshold value (absolute value), the controller 71 may perform the re-measurement processing again at an increased number of measurement points.

Modification Example of Measurement Point

Figure 15:
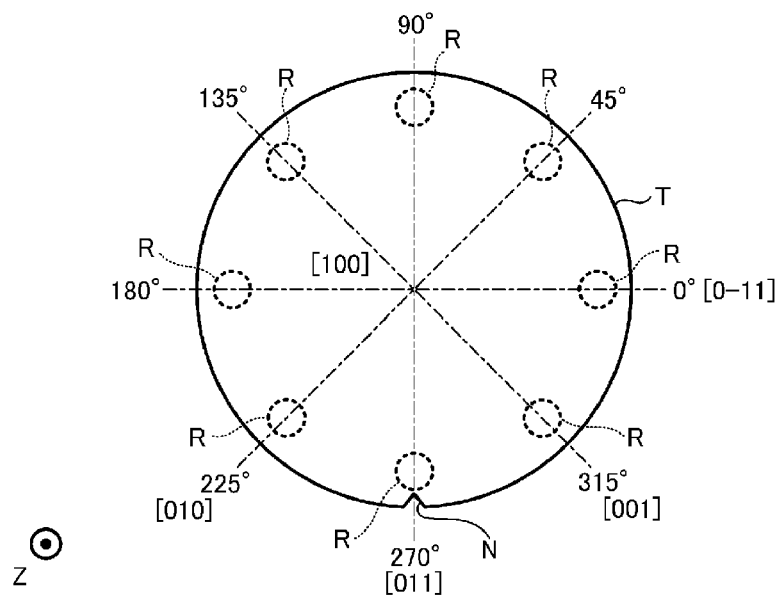
FIG. 15 is a diagram illustrating a first modification example of the measurement points set for the measurement processing.
Figure 16:
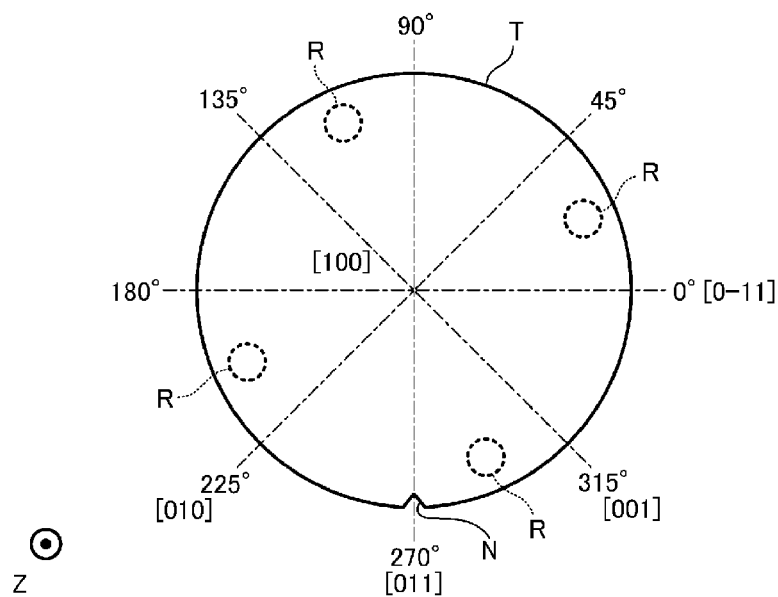
FIG. 16 is a diagram illustrating a second modification example of the measurement points set for the measurement processing.

Hereinafter, modification examples of measurement points set on the inspection target substrate T will be described with reference to FIG. 15 to FIG. 17. First, modification examples of measurement points set for the measurement processing will be described with reference to FIG. 15 and FIG. 16. FIG. 15 is a diagram illustrating a first modification example of measurement points set for a measurement processing. FIG. 16 is a diagram illustrating a second modification example of measurement points set for a measurement processing.

As shown in FIG. 15, the first number of measurement points R for the measurement processing may be set, for example, only on the outer peripheral portion of the inspection target substrate T. Due to the bonding wave by which the bonding region spreads from the central portions toward the outer peripheral portions of the first substrate W1 and the second substrate W2, the deviation amount between the first substrate W1 and the second substrate W2 is greater in the outer peripheral portion of the inspection target substrate T than in the central portion thereof. Accordingly, by setting the measurement points R on the outer peripheral portion of the inspection target substrate T, the deviation between the first substrate W1 and the second substrate W2 can be appropriately measured as compared to a case where the measurement point R is set on the central portion of the inspection target substrate T.

Further, as shown in FIG. 15, the first substrate W1 and the second substrate W2 forming the inspection target substrate T are single crystal silicon wafers each having a [100] crystal direction perpendicular to the surface. Notches N of the first substrate W1 and the second substrate W2 are formed at outer edges of the first substrate W1 and the second substrate W2 in a [011] crystal direction. Further, if a Miller index is of a negative value, a sign "−" (bar) is typically put above the number. In the present exemplary embodiment, however, a minus is put before the number.

When the central portion of the first substrate W1 is pressed down by the striker 190 and brought into contact with the central portion of the second substrate W2 in the bonding device 41, the central portion of the first substrate W1 and the central portion of the second substrate W2 are bonded to each other by the intermolecular force. Thus, the bonding region is formed at the central portions of the both substrates. Then, the bonding wave by which the bonding region spreads from the central portions toward the outer peripheral portions of the both substrates is generated. As a result, the entire bonding surfaces W1j and W2j of the first substrate W1 and the second substrate W2 are bonded to each other.

If the bonding processing is performed while the first substrate W1 is held by using the holder that holds the entire circumference of the outer edge of the first substrate W1, the bonding region is expanded in a concentric shape. However, since the first substrate W1 and the second substrate W2, which are single crystal silicon wafers, have different physical properties such as Young's modulus or Poisson's ratio in 90° directions and 45° directions, they have a difference in degree of distortion in the 90° directions and the 45° directions. Herein, the 90° directions refer to directions at a cycle of 90° (directions of 0°, 90°, 180° and 270° shown in FIG. 15 and the like) with respect to a direction oriented toward a [0-11] crystal direction parallel to the surface of the first substrate W1 from the central portion of the first substrate W1. The 45° directions refer to directions at a cycle of 90° (directions of 45°, 135°, 225° and 315° shown in FIG. 15 and the like) with respect to a direction oriented toward a [010] crystal direction parallel to the surface of the first substrate W1 from the central portion of the first substrate W1.

The values of Young's modulus, Poisson's ratio and shear modulus of a single crystal silicon wafer vary at a cycle of 90°. Specifically, the Young's modulus of the single crystal silicon wafer is highest at the direction of 90° and is lowest at the direction of 45°. Further, the Poisson's ratio and the shear modulus are highest at the direction of 45° and lowest at the direction of 90°.

After the bonding processing is performed as described above, the first substrate W1 and the second substrate W2 are expanded and contracted differently at the 45° directions and the 90° directions. That is, the deviation amount between the first substrate W1 and the second substrate W2 of the inspection target substrate T differs between the 45° directions and the 90° directions.

Accordingly, as shown in FIG. 15, the measurement controller 71a may set four measurement points R in the 45° directions (directions of 45°, 135°, 225° and 315°) and four measurement points R in the 90° directions (directions of 0°, 90°, 180° and 270°). As a result, the deviation between the first substrate W1 and the second substrate W2 can be appropriately measured.

Herein, the measurement points R are set in all of the 45° directions (directions of 45°, 135°, 225° and 315°) and the 90° directions (directions of 0°, 90°, 180° and 270°). However, the present disclosure is not limited thereto. The measurement controller 71a just needs to set the measurement points R in at least one of the 45° directions (directions of 45°, 135°, 225° and 315°) and at least one of the 90° directions (directions of 0°, 90°, 180° and 270°).

Also, as shown in FIG. 16, the measurement controller 71a may set the measurement points R between the 45° directions the 90° directions. For example, in the example shown in FIG. 16, a total of four measurement points R are set at a total of four places between 0° and 45°, between 90° and 135°, between 180° and 225°, and between 270° and 315°. Accordingly, the first number of measurement points can be kept small while rotational symmetry is maintained. Also, the deviation between the first substrate W1 and the second substrate W2 can be appropriately measured.

Then, a modification example of measurement points set for a re-measurement processing will be described with reference to FIG. 17. FIG. 17 is a diagram illustrating a modification example of measurement points set for a re-measurement processing.

Figure 17:
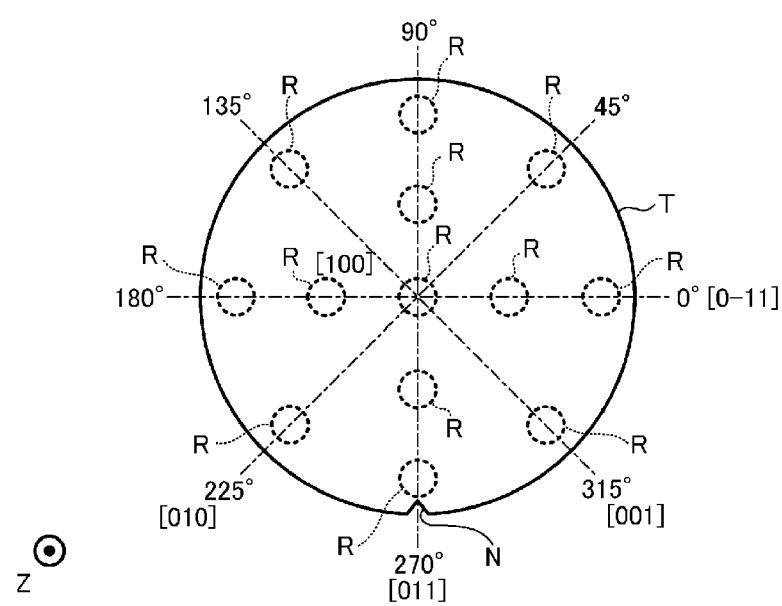
FIG. 17 is a diagram illustrating a modification example of the measurement points set for the re-measurement processing.

As shown in FIG. 17, the re-measurement controller 71e may further set measurement points R between the measurement point R set on the central portion of the inspection target substrate T and the measurement points R set on the outer peripheral portion thereof. In the example shown in FIG. 17, a measurement point R is further set between the measurement point R located on the outer peripheral portion in the direction of 0° and the measurement point R located on the central portion, and between the measurement point R located on the outer peripheral portion in the direction of 90° and the measurement point R located on the central portion. Also, a measurement point R is further set between the measurement point R located on the outer peripheral portion in the direction of 180° and the measurement point R located on the central portion, and between the measurement point R located on the outer peripheral portion in the direction of 270° and the measurement point R located on the central portion. That is, in the example shown in FIG. 17, a total of 13 measurement points are set.

By increasing the second number of measurement points, the accuracy of the re-measurement processing can be further improved. Therefore, it is possible to obtain an inspection result closer to the actual value.

As described above, a bonding system (as an example, the bonding system 1) according to the exemplary embodiment includes a bonding device (as an example, the bonding device 41), an inspection device (as an example, the inspection device 80) and a controller (as an example, the control device 70). The bonding device is configured to form a combined substrate (as an example, the combined substrate T) by bonding a first substrate (as an example, the first substrate W1) and a second substrate (as an example, the second substrate W2) to each other. The inspection device is configured to inspect the combined substrate. The controller is configured to control the inspection device. The controller includes a measurement controller (as an example, the measurement controller 71a), a comparison unit (as an example, the comparison unit 71c) and a re-measurement controller (as an example, the re-measurement controller 71e). The measurement controller is configured to cause the inspection device to measure the combined substrate at a first number of measurement points (as an example, five measurement points). The comparison unit is configured to compare, with a reference (as an example, reference information 72b), an inspection result (as an example, inspection result information 72a) including a deviation amount between the first substrate and the second substrate in the combined substrate based on a measurement result. The re-measurement controller is configured to cause the inspection device to re-measure the combined substrate at a second number of measurement points (as an example, nine measurement points) greater than the first number of measurement points based on a comparison result obtained by the comparison unit.

Therefore, according to the bonding system according to the exemplary embodiment, it is possible to improve the throughput while securing the measurement accuracy of the inspection device.

The controller may further include a determination unit (as an example, the determination unit 71d) configured to determine that the first substrate and the second substrate are poorly bonded when a difference between the inspection result and the reference exceeds a first threshold value (as an example, a range of from −50 nm to +50 nm). In this case, the re-measurement controller may cause the inspection device to re-measure the combined substrate when the difference between the inspection result and the reference exceeds a second threshold value (as an example, a range of from −30 nm to +30 nm) smaller than the first threshold value and does not exceed the first threshold value.

If the difference between the inspection result and the reference exceeds the second range and does not exceed the first range, it is considered that the accuracy of measurement performed at the first number of measurement points is not sufficient. Therefore, if the difference between the inspection result and the reference exceeds the second range and does not exceed the first range, the measurement accuracy can be improved by performing the re-measurement. However, if the difference between the inspection result and the reference exceeds the first range, i.e., if the difference between the inspection result and the reference is so large that it exceeds a range of measurement error of the inspection device, it can be determined as poor bonding without performing the re-measurement.

The controller may further include a reference generator (as an example, the reference generator 71b). The reference generator is configured to generate, based on the inspection result for an inspection completion combined substrate (as an example, the inspection completion substrate T) which has been inspected before an inspection target combined substrate (as an example, the inspection target substrate T) to be currently inspected, the reference for the inspection target combined substrate.

The reference generator may generate the reference for the inspection target combined substrate based on the inspection result for one or multiple inspection completion combined substrates in a same lot as the inspection target combined substrate. By using the inspection results for the inspection completion combined substrates in the same lot, the appropriate reference for the inspection target combined substrate can be generated.

The reference generator may generate, as the reference for the inspection target combined substrate, the inspection result for the inspection completion combined substrate, which is firstly processed, among the multiple inspection completion combined substrates in the same lot. In this case, the reference can be commonly used for the multiple combined substrates in the same lot except the firstly processed combined substrate. Thus, it is possible to reduce the load of processing for generating the reference.

The reference generator may generate, as the reference for the inspection target combined substrate, an average value of the inspection result for two or more inspection completion combined substrates among the multiple inspection completion combined substrates in the same lot. Thus, the reliability of the reference can be improved.

The reference generator may generate, as the reference for the inspection target combined substrate, the inspection result for the inspection completion combined substrate which is in a different lot from the inspection target combined substrate and has been processed in a same order as the inspection target combined substrate in the different lot. By using the inspection result for the combined substrate processed in the same order as the reference, the reliability of the reference can be improved.

The measurement controller may set the first number of measurement points (as an example, the measurement point R) only on an outer peripheral portion of the combined substrate. Further, the re-measurement controller may set the second number of measurement points in total on the outer peripheral portion and a central portion of the combined substrate. Due to the bonding wave by which the bonding region spreads from central portions toward the outer peripheral portions of the first substrate and the second substrate, the deviation amount between the first substrate and the second substrate is greater in the outer peripheral portion of the inspection target substrate than in the central portion thereof. Accordingly, by setting the measurement points on the outer peripheral portion of the inspection target combined substrate, the deviation between the first substrate and the second substrate can be appropriately measured as compared to the case where the measurement point is set on the central portion of the inspection target combined substrate.

The first substrate and the second substrate may be single crystal silicon wafers each having a [100] crystal direction on a surface. In this case, the measurement controller may set measurement points on at least one of four first outer peripheral portions arranged at an interval of 90° with respect to a direction of 45° and at least one of four second outer peripheral portions arranged at an interval of 90° with respect to a direction of 90° when a direction oriented toward a [0-11] crystal direction parallel to the surface of the combined substrate from a central portion of the combined substrate is defined as 0°. After the first substrate and the second substrate, which are the single crystal silicon wafers each having the [100] crystal direction on the surface, are bonded to each other, the deviation amount between the first substrate and the second substrate differs between the 45° directions and the 90° directions. Accordingly, by setting the measurement points in the 45° directions and the 90° directions, the deviation between the first substrate W1 and the second substrate W2 can be appropriately measured.

According to the above-described exemplary embodiment, the bonding device bonds the first substrate and the second substrate to each other using the intermolecular force generated between the modified bonding surfaces of the first substrate and the second substrate by pressing down the central portion of the first substrate and bringing the first substrate into contact with the second substrate by the striker. However, the present disclosure is not limited thereto. The bonding device may also be, for example, a bonding device that bonds the first substrate and the second substrate to each other via an adhesive.

Here, it should be noted that the above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of the appended claims.

EXPLANATION OF CODES

According to the present disclosure, it is possible to improve the throughput while securing the measurement accuracy of the inspection device.

We claim:

1. A bonding system, comprising:
a bonding device configured to form a combined substrate by bonding a first substrate and a second substrate to each other;
an inspection device configured to inspect the combined substrate; and
a controller configured to control the inspection device, wherein the controller includes:
a measurement controller configured to cause the inspection device to measure the combined substrate at a first number of measurement points;
a comparison unit configured to compare, with a reference, an inspection result including a deviation amount between the first substrate and the second substrate in the combined substrate based on a measurement result; and
a re-measurement controller configured to cause the inspection device to re-measure the combined substrate at a second number of measurement points greater than the first number of measurement points based on a comparison result obtained by the comparison unit.

2. The bonding system of claim 1,
wherein the controller further includes a determination unit configured to determine that the first substrate and the second substrate are poorly bonded when a difference between the inspection result and the reference exceeds a first threshold value, and
the re-measurement controller causes the inspection device to re-measure the combined substrate when the difference between the inspection result and the reference exceeds a second threshold value smaller than the first threshold value and does not exceed the first threshold value.

3. The bonding system of claim 1,
wherein the controller further includes a reference generator configured to generate, based on the inspection result for an inspection completion combined substrate which has been inspected before an inspection target combined substrate to be currently inspected, the reference for the inspection target combined substrate.

4. The bonding system of claim 3,
wherein the reference generator generates the reference for the inspection target combined substrate based on the inspection result for one or multiple inspection completion combined substrates in a same lot as the inspection target combined substrate.

5. The bonding system of claim 4,
wherein the reference generator generates, as the reference for the inspection target combined substrate, the inspection result for the inspection completion combined substrate, which is firstly processed, among the multiple inspection completion combined substrates in the same lot.

6. The bonding system of claim 4,
wherein the reference generator generates, as the reference for the inspection target combined substrate, an average value of the inspection result for two or more inspection completion combined substrates among the multiple inspection completion combined substrates in the same lot.

7. The bonding system of claim 3,
wherein the reference generator generates, as the reference for the inspection target combined substrate, the inspection result for the inspection completion combined substrate which is in a different lot from the inspection target combined substrate and has been processed in a same order as the inspection target combined substrate in the different lot.

8. The bonding system of claim 1,
wherein the measurement controller sets the first number of measurement points only on an outer peripheral portion of the combined substrate, and
the re-measurement controller sets the second number of measurement points in total on the outer peripheral portion and a central portion of the combined substrate.

9. The bonding system of claim 1,
wherein the first substrate and the second substrate are single crystal silicon wafers each having a [100] crystal direction on a surface, and
the measurement controller sets measurement points on at least one of four first outer peripheral portions arranged at an interval of 90° with respect to a direction of 45° and at least one of four second outer peripheral portions arranged at an interval of 90° with respect to a direction of 90° when a direction oriented toward a [0-11] crystal direction parallel to the surface of the combined substrate from a central portion of the combined substrate is defined as 0°.

10. An inspection method of inspecting a combined substrate, which is formed by bonding a first substrate and a second substrate to each other,
wherein the inspection method is performed by a controller configured to control an inspection device,
the controller includes a measurement controller, a comparison unit, and a re-measurement controller, and
the inspection method comprises:
causing the inspection device to measure the combined substrate at a first number of measurement points by the measurement controller;
comparing, with a reference, an inspection result including a deviation amount between the first substrate and the second substrate of the combined substrate based on a measurement result by the comparison unit; and
causing the inspection device to re-measure the combined substrate at a second number of measurement points greater than the first number of measurement points based on a comparison result obtained in the comparing of the inspection result with the reference by the re-measurement controller.

* * * * *